United States Patent [19]

Shing et al.

[11] Patent Number: 5,427,827
[45] Date of Patent: Jun. 27, 1995

[54] DEPOSITION OF DIAMOND-LIKE FILMS BY ECR MICROWAVE PLASMA

[75] Inventors: Yuh-Han Shing, Thousand Oaks; Frederick S. Pool, Pasadena, both of Calif.

[73] Assignee: The United States of America as represented by the Administrator of the National Aeronautics and Space Administration, Washington, D.C.

[21] Appl. No.: 888,411

[22] Filed: May 21, 1992

Related U.S. Application Data

[63] Continuation of Ser. No. 677,070, Mar. 29, 1991, abandoned.

[51] Int. Cl.$^6$ .......................... B05D 3/06; C23C 16/26
[52] U.S. Cl. .................................... 42.7/577; 427/575; 427/571; 427/598; 427/249; 427/122; 423/446; 428/408
[58] Field of Search ............... 427/577, 575, 571, 598, 427/249, 122; 423/446; 428/408; 156/DIG. 68

[56] References Cited

U.S. PATENT DOCUMENTS

| | | | |
|---|---|---|---|
| H566 | 1/1989 | Nyaiesh et al. | 427/38 |
| 4,434,188 | 2/1984 | Kamo et al. | |
| 4,504,519 | 3/1985 | Zelez. | |
| 4,859,493 | 4/1989 | Lemelson. | |
| 4,869,923 | 9/1989 | Yamazaki. | |
| 4,871,581 | 10/1989 | Yamazaki. | |
| 4,915,977 | 4/1990 | Okamoto et al. | |
| 4,935,303 | 6/1990 | Ikoma et al. | |
| 4,939,763 | 7/1990 | Pinnio et al. | |
| 4,940,015 | 7/1990 | Kobashi et al. | |
| 4,952,273 | 8/1990 | Popov | 156/643 |
| 4,996,079 | 2/1991 | Itoh | 427/575 |
| 5,026,415 | 6/1991 | Vasamoto et al. | 427/133 |
| 5,039,548 | 8/1991 | Hirose et al. | 427/575 |

FOREIGN PATENT DOCUMENTS

| | | |
|---|---|---|
| 60-103098 | 6/1985 | Japan. |
| 60-103099 | 6/1985 | Japan. |
| 62-224923 | 10/1987 | Japan. |
| 63-085092 | 4/1988 | Japan. |
| 63-22402 | 9/1988 | Japan. |
| 63-239192 | 10/1988 | Japan. |
| 1-104777 | 4/1989 | Japan. |
| 63-128459 | 12/1989 | Japan. |
| 2-133573 | 5/1990 | Japan. |
| 2-107774 | 8/1990 | Japan. |
| 2-225671 | 9/1990 | Japan. |
| 2-225672 | 9/1990 | Japan. |

OTHER PUBLICATIONS

Popov et al, "Electron cyclotron resonance plasma stream source for plasma enhanced chemical vapor deposition", J. Vac. Sci. Technol. A7(3) May/Jun. 1989, pp. 914–917.

Savvides, "Diamond Growth From The Vapor Phase", Ceramic Developments edited by C. C. Sorrell et al, Materials Science Forum vol. 34–36 (1988) pp. 487–495.

English language abstract of Japanese Patent No. 63-085092 to Araki et al. Apr. 15, 1988.

English language abstract of Japanese Patent No. 01-298165, Dec. 1, 1989.

*Primary Examiner*—Roy V. King
*Attorney, Agent, or Firm*—John H. Kusmiss; Thomas H. Jones; Guy M. Miller

[57] ABSTRACT

Hard amorphous hydrogenated carbon, diamond-like films are deposited using an electron cyclotron resonance microwave plasma with a separate radio frequency power bias applied to a substrate stage. The electron cyclotron resonance microwave plasma yields low deposition pressure and creates ion species otherwise unavailable. A magnetic mirror configuration extracts special ion species from a plasma chamber. Different levels of the radio frequency power bias accelerate the ion species of the ECR plasma impinging on a substrate to form different diamond-like films. During the deposition process, a sample stage is maintained at an ambient temperature of less than 100° C. No external heating is applied to the sample stage. The deposition process enables diamond-like films to be deposited on heat-sensitive substrates.

5 Claims, 6 Drawing Sheets

DEPOSITION OF DIAMOND-LIKE FILMS BY ECR MICROWAVE PLASMA

ORIGIN OF THE INVENTION

The invention described herein was made in the performance of work under a NASA contract, and is subject to the provisions of Public Law 96-517 (35 U.S.C. Section 202) in which the Contractor has elected not to retain title.

This application is a continuation of U.S. application Ser. No. 07/677,070, filed Mar. 29, 1991, now abandoned.

TECHNICAL FIELD

The subject invention relates generally to film deposition processes and systems and, more particularly, to an improved diamond-like film deposition process and system.

BACKGROUND ART

Amorphous hydrogenated carbon (a-C:H) films have been deposited using a variety of chemical vapor deposition (CVD) techniques wherein a chemical process taking place in the vapor phase of the gas next to the substrate causes the reaction product to be deposited. One prior art technique involves placing a substrate for deposition in a reaction chamber and heating the substrate to a temperature of 800° C. to 1000° C. Hydrogen gas is then fed into the reaction chamber, and microwave power is applied at 1 kilowatt with a frequency of 2.45 GHz. A magnetic field of about 2000 Gauss is simultaneously applied to the reaction chamber for forming an electron cyclotron resonance condition in the reaction chamber so that the plasma electrons will be caused to orbit the magnetic field at a resonant frequency and trap or confine the plasma ions.

A carbon compound gas, that acts as a catalyst, is introduced into the reaction chamber at a relatively high pressure of up to 760 Torr. The catalytic gas, in combination with the magnetic field and microwave power, allows a hard carbon film to be formed on a substrate disposed in the reaction chamber.

A disadvantage of this method is that catalytic gases containing minerals such as nickel, manganese, or germanium must be introduced into the system to be used as a catalyst. Another disadvantage is that heat sensitive substrates, such as plastic, are unable to withstand these high temperatures. The discussed method is disclosed in U.S. Pat. No. 4,871,581, by S. Yamazaki.

A similar prior art method of depositing diamond-like films on a substrate is disclosed in U.S. Pat. No. 4,935,303, by Ikoma et al. In the disclosed method, a first magnetic field of 1300 Gauss is applied to a plasma producing chamber, and a second magnetic field of 875 Gauss is applied near the surface of a substrate. The substrate is maintained at a temperature between 350° C. and 700° C., with 580° C. being preferred. If the substrate is not maintained above 350° C., a diamond-like film may not form on the substrate. If a film is formed, the hydrogen content was excessively high and the film is too low in density, resulting in low chemical and structural stability.

Again, a disadvantage to the above method, is the inability to form diamond-like films on substrates at temperatures less than 350° C. Another disadvantage of the method is its requirement of a substantially strong magnetic field.

Accordingly, a method of depositing films, with such properties as extreme hardness, optical transparency, and chemical inertness, onto substrates that are heat sensitive, would be a solution to these problems.

STATEMENT OF THE INVENTION

It is therefore an object of the present invention to provide a method of depositing diamond-like films onto a substrate;

It is another object of the present invention to provide a method for depositing diamond-like films onto heat-sensitive substrates;

It is another object of the present invention to provide a method for depositing diamond-like films on irregularly-shaped substrates;

It is another object of the present invention to provide a deposition method capable of operating at ambient temperature; and It is another object of the present invention to provide an improved electron cyclotron resonance deposition system.

These and other objects and advantages of the present invention are achieved by providing an electron cyclotron resonance plasma deposition system having radio frequency (RF) power applied to a sample stage disposed in the deposition chamber. The radio frequency (RF) power applied to the sample stage during the invented method induces a negative self-bias voltage in the sample stage, enabling various diamond-like films to be very easily formed on a substrate mounted on the sample stage. During the deposition process, no external heat is applied to the sample stage, to maintain the sample stage at an ambient temperature of less than 100° C.

In the preferred embodiment, when a low RF power bias is applied to the sample stage, a high negative, self-bias voltage of approximately $-100$ volts is induced in the sample stage for forming a desired diamond-like film on the substrate. One advantage of this system is that, when the low energy ions of the electron cyclotron resonance (ECR) plasma are impinging onto the substrate, with the high negative self-bias voltage induced in the sample stage, a diamond-like film having a Raman spectrum consisting of broad and overlapping graphitic D (1360 $cm^{-1}$) and graphitic G (1590 $cm^{-1}$) lines may be formed on the substrate.

When a high RF power bias is applied to the sample stage, a low negative self-bias voltage of approximately $-3$ volts is induced in the sample stage. This results in a diamond-like film having a broad Raman peak centered at approximately 1500 $cm^{-1}$ being formed on the substrate.

In the invented deposition process of the present invention, the substrate is maintained at ambient temperatures of less than 100° C. during the deposition process. This ambient temperature deposition process enables heat-sensitive substrates, such as plastic, to be coated with diamond-like films. Three-dimensional substrates and other irregular substrates, such as those used in microelectronics and optics, can also be coated with diamond-like films using the invented process and accompanying system.

BRIEF DESCRIPTION OF THE DRAWINGS

The present invention, both as to its organization and manner of operation, together with further objects and advantages, may be understood by reference to the accompanying drawings.

DETAILED DESCRIPTION OF THE INVENTION

The following description is provided to enable any person skilled in the plasma deposition art to make and use the invention, and sets forth the best modes contemplating by the inventors for carrying out their invention. Various modifications, however, will remain readily apparent to those skilled in these arts.

Figure 1:
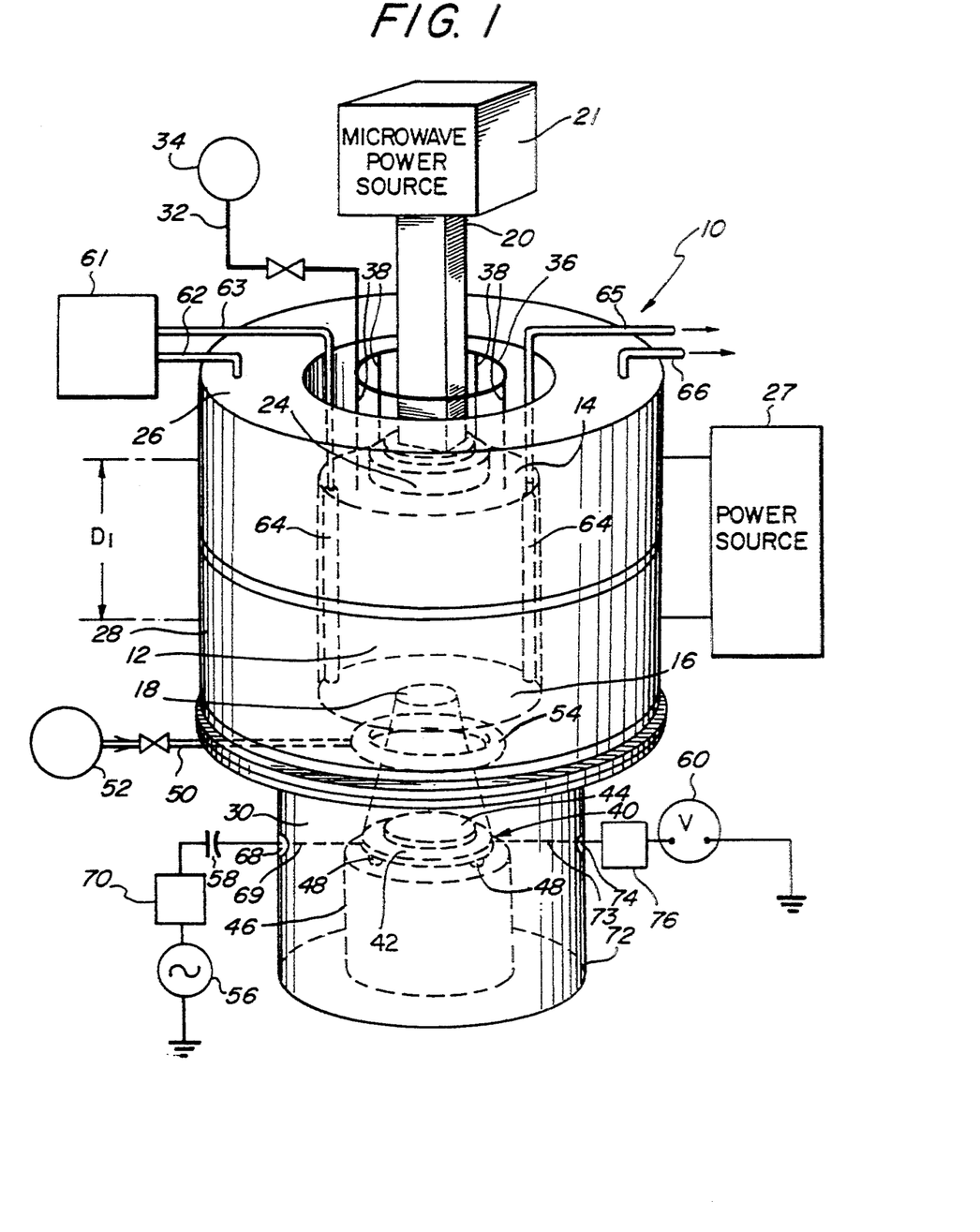
FIG. 1 is a perspective view, partially shown in phantom, of an electron cyclotron resonance deposition system incorporating the preferred embodiment of the present invention.
Figure 2:
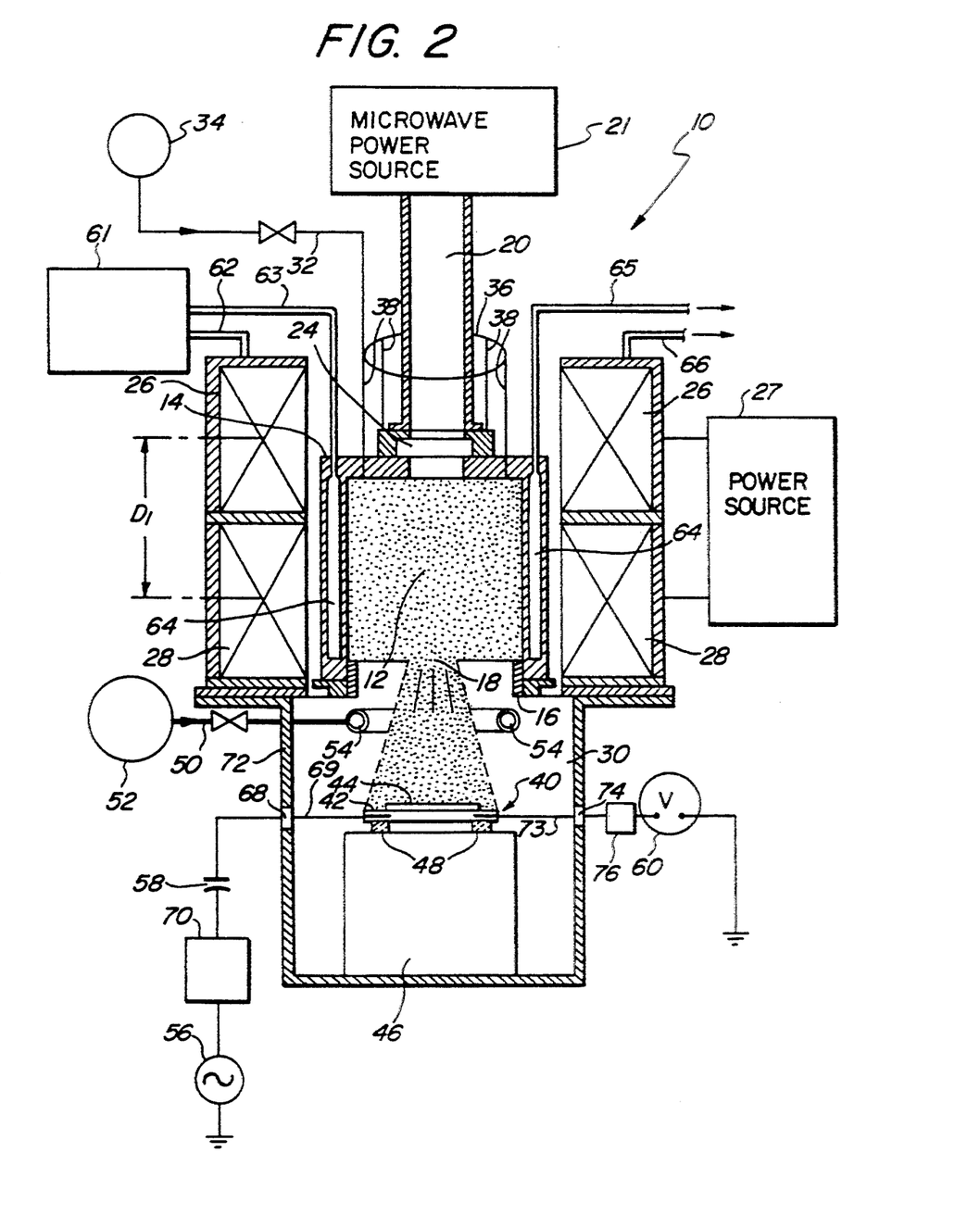
FIG. 2 is a cross-sectional plan view of the preferred embodiment.

With reference to FIGS. 1 and 2, there is shown an electron cyclotron resonance (ECR) deposition system 10 according to the preferred embodiment of the present invention. A cylindrical plasma chamber 12 has a top 14 and a bottom 16. The bottom 16 has an aperture 18 disposed through the bottom's center. A rectangular waveguide 20 is connected between a microwave power source 21 and the plasma chamber 12. The waveguide 20 connects to the plasma chamber's top 14 through a quartz window 24.

Two annular magnetic coaxial coils 26, 28 are disposed around the outer periphery of the plasma chamber 12. In the embodied structure, the magnetic coils 26, 28 are disposed parallel to one another with a distance $D_1$ between their center regions of approximately 33 cm. A power source 27 supplies power to the magnetic coils 26, 28 for supplying a confining magnetic field to the plasma chamber 12, in a magnetic-mirror configuration.

An electron resonance condition is set up at the upper portion of the plasma chamber 12 by the top magnetic coil 26 generating a magnetic field of approximately 875 Gauss. A divergent magnetic field profile is set up by the bottom magnetic coil 28 generating a smaller, variable magnetic field, to extract electron cyclotron resonance (ECR) plasma, when formed, into a cylindrical deposition chamber 30 connected to the plasma chamber's bottom 16.

The magnetic-mirror configuration may be manipulated to extract specific plasma ion energies during the deposition process. The energy profile of the plasma ions extracted from a confinement region, located between the two magnetic coils 26, 28 in the plasma chamber 12, is dependent on the magnetic field strength and the voltage potential difference between generated plasma and a sample stage 42.

A first tube 32 is used to transfer a plasma generation gas, such as hydrogen ($H_2$), from a storage tank 34 to an annular distribution manifold 36. The annular distribution manifold 36 has a plurality of inlet tubes 38 that extend into the plasma chamber's top 14 for disbursing the plasma generation gas into the plasma chamber 12.

A cylindrical can 46 is mounted in the deposition chamber 30 for positioning a substrate stage 40 in the deposition chamber 30. The substrate stage 40 includes a sample stage 42 which may be stainless steel, and a substrate 44 mounted on the sample stage 42. The substrate 44 should be positioned approximately 15 cm from the aperture 18. The can 46 may be stainless steel and be approximately 15 cm in height and 14 cm in diameter. A plurality of cylindrical electrical isolation posts 48 are used to electrically isolate the substrate stage 40 from the system 10. In the embodied structure, the cylindrical posts 48 may be approximately ⅛-inch in diameter and ⅜-inch in height, and are generally ceramic.

The substrate 44 may be silicon, Dow Corning 7059 optical glass, or quartz, or any other applicable substrate known in the art. The substrate 44 is typically prepared for deposition by known methods in the art, such as first ultrasonically cleaning in an acetone and isopropyl alcohol solution, then rinsing in deionized water. The substrate 44 preparation process may take five minutes.

A second gas transfer tube 50 extends from a gas storage tank 52 into the deposition chamber 30, and finally terminates in a circular gas distribution ring 54. The second tube 50 is used to transfer a reaction gas, such as a suitable hydrocarbon gas, from the storage tank 52 to the circular gas ring 54, for disbursing the reaction gas into the deposition chamber 30. Suitable hydrocarbon gases include methane, acetylene, and propane.

In an alternative embodiment, the reaction gas may be mixed with the plasma generation gas, and the two gases simultaneously disbursed into the plasma chamber 12 through the annular distribution ring 36.

In the preferred embodiment, a radio frequency (RF) generator 56 is connected to the sample stage 42 through an RF matching circuit 70. The RF matching circuit 70 couples to the sample stage 42 through a first vacuum feedthrough 68 disposed in the deposition chamber's wall 72. The sample stage 42 is connected to the vacuum feedthrough 68, using an RF cable 69.

The RF generator 56 provides an RF power bias at approximately 13.56 MHz for inducing a low negative self-bias voltage, of approximately −3 volts in the sample stage 42. For inducing a high negative self-bias voltage of approximately −100 volts in the sample stage 42, an isolating capacitor 58 of about 0.1 $\mu F$ is connected between the RF matching circuit 70 and feedthrough 68, giving an approximately infinite DC impedance to ground.

The level of induced negative self-bias voltage is measured by a voltmeter 60. The voltmeter 60 is connected to the sample stage 42 through an RF filter 76 and a second vacuum feedthrough 74 disposed in the deposition chamber's wall 72. The sample stage 42 is connected to the second feedthrough 74 using a piece of conductive wire 73.

Different levels of the applied RF power bias accelerates ions of the ECR plasma impinging on the substrate 44. Thus, different diamond-like films are caused to form on the substrate 44 when undergoing deposition processing.

A cooling agent, such as water, is used for cooling the coils 26, 28. The cooling agent is fed from a tank 61, through an input tube 62, after which it passes around the magnetic coils 26, 28 in series, and then exits through tube 66. A cavity 64 is disposed about the outer periphery of the plasma chamber 12. Water in the tank 61 passes through a tube 63 into the cavity 64 and out through an exit tube 65 for cooling the plasma chamber 12.

In operation, the desired substrate 44 is mounted on the sample stage 42. Plasma generation gas is then disbursed into the plasma chamber 12 through the inlet tubes 38. The reaction gas is disposed into the deposition chamber 30 through the gas ring 54. The gases are disbursed into the chambers 12, 30 at a low pressure of $10^{-1}$ to $10^{-2}$ Torr to achieve a high plasma density.

Approximately 360 watts of microwave power is transmitted at approximately 2.45 GHz through the rectangular waveguide 20 and quartz window 24 into the plasma chamber 12. ECR plasma is generated by the microwave power being absorbed by the gases and exciting them, thus fully ionizing the gases. The ion energy of the ECR plasma is approximately 1-5 electron volts. The low ion energy is due to the moderate sheath voltage inherent in a plasma generated by microwave excitation.

The sample stage 42 is biased by applying RF power from the RF generator 56 via the RF matching circuit 70. In the preferred method, the RF generator 56 supplies either 5 watts or 30 watts of RF power to the sample stage 42, depending on whether or not capacitor 58 is present. A large RF power bias may be applied to the sample stage 42 by removing the isolating capacitor 58. This results in an induced DC self-bias voltage of approximately $-3$ volts in the sample stage 42 during the deposition process. A low RF power bias may be applied to the sample stage 42 by including the capacitor 58. This results in an induced DC self-bias voltage of approximately $-100$ volts in the sample stage 42 during deposition.

Desired plasma ions are extracted by the magnetic fields, caused by the magnetic coils 26, 28, from the plasma chamber 12 and deposited onto the substrate 44, for forming a desired diamond-like film on the substrate 44. Different diamond-like films may be formed on the substrate 44 in response to RF power bias applied to the sample stage 42, which accelerates the plasma ions impinging on the substrate 44.

With reference to FIGS. 3A, 3B, 4, and 5, a series of tests were conducted to illustrate the advantages of the invented process and system over the prior art. The substrates 44 were positioned approximately 15 cm below the aperture 18. Optical gaps for the formed diamond-like films were obtained from a Tauc relation equation:

$$(\alpha E)^{\frac{1}{2}} = B(E - E_g)$$

where $\alpha$ is an absorption coefficient, E is energy, B is a constant, and $E_g$ is the optical gap. The Raman spectra of the diamond-like (a-C:H) films is measured at room temperature with a 514.45 nm line of an argon laser.

Films deposited without an external bias applied to the sample stage 42 show an optical band gap of approximately 2.8 eV and a deposition rate of 2.3 Å/s. These films are mechanically soft and have a broad fluorescence in the spectral range of 450-650 nm. This fluorescence prevented the Raman spectra of these films from being measured.

Figure 3A:
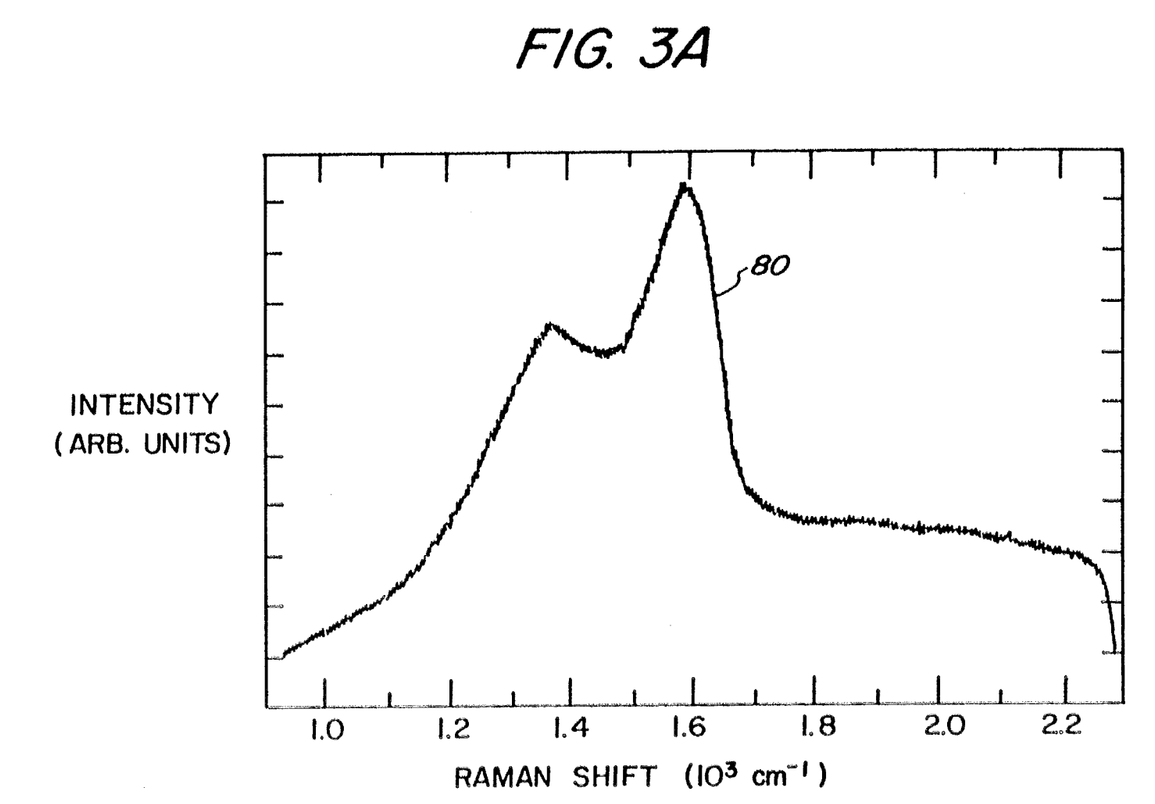
FIGS. 3A and 3B are graphical representations of Raman spectra obtained from diamond-like films formed on substrates using the preferred method of the present invention.
Figure 3B:
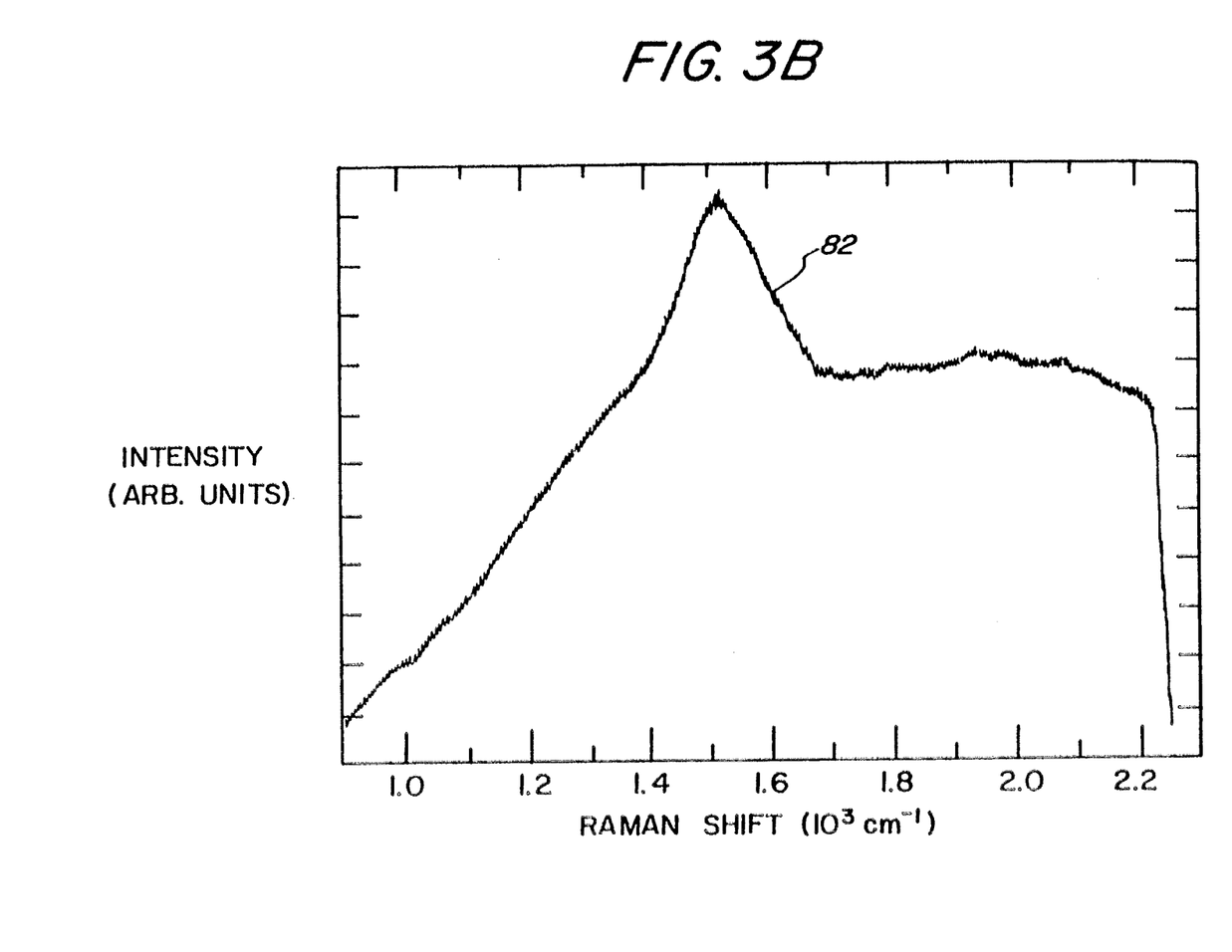

Substrates 44 deposited with the 13.56 MHz RF external power bias applied to the sample stage 42 in accordance with a preferred method of the invention are shown in FIGS. 3A and 3B. In a first sample, Sample A, substrate 44, was deposited with an applied magnetic field of approximately 875 Gauss and an RF bias of 30 watts applied to the sample stage 42. The 30-watt power bias was applied without the isolating capacitor 58, which resulted in an induced negative DC self-bias voltage of approximately $-3$ volts to the sample stage 42 during deposition. The ratio of $CH_4$ to $H_2$ concentration was 50% at a pressure of 5 mTorr. The deposition rate was approximately 5-6 Å/s. Measurement of the optical gap for the first sample yielded a value of $E_g = 1.4$ eV. The Raman spectra of the formed diamond-like film is shown in FIG. 3A.

Figure 5:
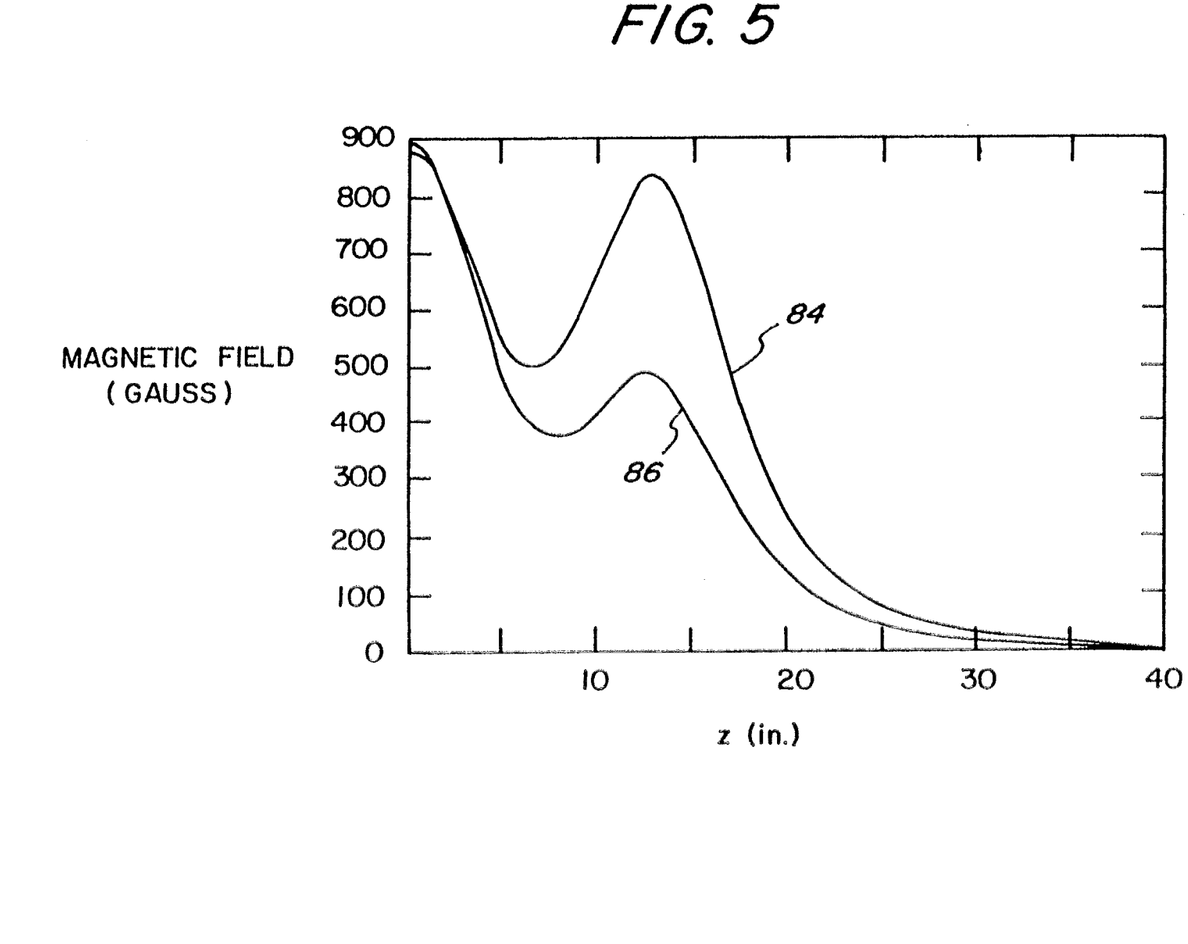
FIG. 5 is a graphical illustration of varying magnetic field profiles used in the preferred method.

A second sample substrate 44, Sample B, was deposited with a low RF power bias of 5 watts applied to the sample stage 42, and an applied magnetic field of approximately 875 Gauss. The magnetic field profile 84 for Sample B is shown in FIG. 5. The low RF power bias applied through the isolating capacitor 58 resulted in a large negative DC self-bias voltage of approximately $-100$ volts in the sample stage 42. The sample film was deposited onto the substrate 44 at a pressure of 17 mTorr and a concentration of 17% $CH_4$. This resulted in a deposition rate of 0.5 Å/s.

Figure 4:
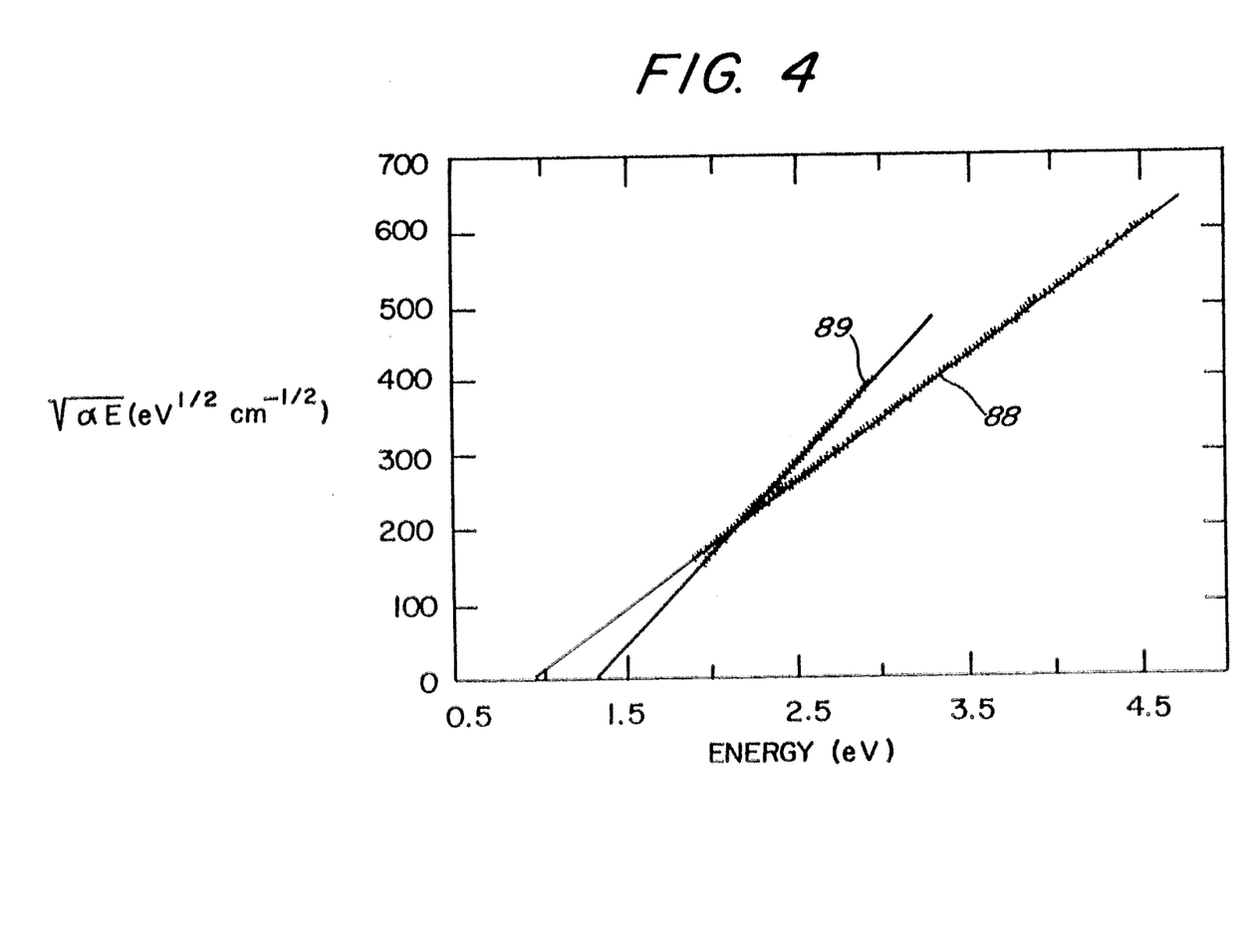
FIG. 4 is a graphical illustration of Tauc plots for the diamond-like films formed using the preferred method.

The lower deposition rate was caused by increased hydrogen ion etching, given the negative bias voltage, and higher hydrogen fraction of the plasma. The optical gap of the second sample was 1.0 eV. The Raman spectra for the second sample is shown in FIG. 3B. The Tauc plots for the deposition process used on Sample A 88 and Sample B 89 substrates 44 are shown in FIG. 4.

A third substrate 44, Sample C, was subjected to a deposition process similar to that of Sample B, except the deposition process was completed with a reduced mirror magnetic field. The mirror magnetic field used during the Sample C deposition process was approximately 500 Gauss. The magnetic field profile 86 for the deposition processes used on Sample C substrate 44 is shown in FIG. 5. The optical gap was found to increase from 1.0 to 1.6 eV.

A fourth substrate 44, Sample D, was deposited with the same parameters as the Sample B deposition process, except at an increased pressure of 55 mTorr. The effect of increasing the deposition pressure was found to decrease the optical gap from 1.6 to 1.2 eV. The Raman spectra of the Samples C and D deposition processes are similar to that of Sample B, as shown in FIG. 3B.

All of the sample deposition processes resulted in amorphous hydrogenated carbon (a-C:H) "diamond-like" films, having a hard diamond-like quality. A comparison of the Raman spectra and optical gaps indicate that more than one hard diamond-like film morphology is present at a given optical gap. Film characteristics were also shown to be dependent on the magnetic field profile used during the deposition process. The results of the sample deposition processes indicate that increasing the energy of the ions incident on the substrate results in an increased optical gap. Use of the RF induced negative self-bias DC voltage of the substrate stage, and manipulation of the magnetic field profile in the ECR microwave plasma system has proven to be an advantageous technique for the deposition of diamond-like films on heat-sensitive substrates.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

We claim:

1. A method of depositing diamond-like films on a substrate in a closed deposition station having a plasma chamber connected to a deposition chamber and having first and second coils, for generating, respectively, a first and a second magnetic field, disposed around the plasma chamber, with the second coil being in proximity to an aperture connecting the plasma chamber and the depositing chamber, comprising the steps of:

mounting the substrate on a sample stage in the deposition chamber;

dispersing plasma generating gases into said plasma chamber;

transmitting microwave power into the plasma generating gases through a microwave window into said plasma chamber for generating a plasma;

adjusting the current applied to said first coil to obtain a first magnetic field strength of approximately 875 Gauss for producing an electron cyclotron resonance plasma condition in the plasma chamber;

adjusting the current applied to said second coil to obtain a second magnetic field strength thereby extracting specific plasma ion energies for entering said deposition chamber;

maintaining the sample stage at ambient temperature;

applying radio frequency power directly to the sample stage for inducing a negative self-bias having a magnitude ranging between, $-100$ Volts and $-3$ Volts on the sample stage; and disbursing a reaction gas into said deposition chamber; thereby depositing an optically transparent diamond-like film which has an optical gap of about 1 to 1.6 electron volts.

2. The method of claim 1 wherein said step of depositing diamond-like films onto the substrate is performed while maintaining the sample stage at less than 100° C.

3. The method of claim 2, wherein about 30 watts of radio frequency power at about 13.56 MHz are applied to the sample stage to induce a negative self-bias voltage in the sample stage of approximately $-3$ volts.

4. The method of claim 2, wherein about 5 watts of radio frequency power at 13.56 MHz are applied to the sample stage, through a blocking capacitor, to induce a negative self-bias voltage in the sample stage of approximately $-100$ volts.

5. The method of claim 4 wherein the step of depositing diamond-like films onto the substrate is performed as a pressure of substantially 7 milli-Torr.

* * * * *